(12) United States Patent
Isoda

(10) Patent No.: US 7,039,376 B2
(45) Date of Patent: May 2, 2006

(54) AGC AMPLIFIER CIRCUIT FOR USE IN A DIGITAL SATELLITE BROADCAST RECEIVER APPARATUS

(75) Inventor: Hiroshi Isoda, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 761 days.

(21) Appl. No.: 09/922,856

(22) Filed: Aug. 7, 2001

(65) Prior Publication Data

US 2002/0025792 A1    Feb. 28, 2002

(30) Foreign Application Priority Data

Aug. 29, 2000    (JP) ............................. 2000-258597

(51) Int. Cl.
    *H04B 1/06*    (2006.01)

(52) U.S. Cl. ............................... 455/232.1; 455/127.2; 455/239.1; 375/345; 330/278

(58) Field of Classification Search ............... 455/3.02, 455/136, 232.1–234.1, 242.2–245.1, 245.2–254, 455/127.1–127.3, 195.1; 361/68; 375/297; 330/254, 278
See application file for complete search history.

(56) References Cited

U.S. PATENT DOCUMENTS

| 4,996,501 | A | * | 2/1991 | Sano et al. ................. 330/278 |
| 5,020,146 | A | * | 5/1991 | Pugel ...................... 455/195.1 |
| 6,044,253 | A | * | 3/2000 | Tsumura .................. 455/234.1 |
| 6,128,479 | A | * | 10/2000 | Fitzpatrick et al. ......... 455/137 |
| 6,232,839 | B1 | * | 5/2001 | Honda ........................ 330/254 |
| 6,647,072 | B1 | * | 11/2003 | Shibamura .................. 375/297 |
| 6,788,744 | B1 | * | 9/2004 | Hirama ...................... 375/297 |

FOREIGN PATENT DOCUMENTS

JP          A5206766        8/1993

* cited by examiner

Primary Examiner—Fan Tsang
Assistant Examiner—Md S. Elahee
(74) Attorney, Agent, or Firm—Birch, Stewart, Kolasch & Birch, LLP

(57) ABSTRACT

An AGC amplifier circuit has a fixed-gain amplifier, of which the gain is not controlled by an AGC voltage, and a variable-gain amplifier, of which the gain is controlled by the AGC voltage, that are connected in parallel. When the AGC voltage is within a predetermined voltage range, the overall gain of the AGC amplifier circuit is varied by the variable-gain amplifier; however, when the AGC voltage is outside the predetermined voltage range, the overall gain is kept constant by the fixed-gain amplifier. The minimum gain of the AGC amplifier circuit is set to be equal to the gain of the fixed-gain amplifier.

9 Claims, 9 Drawing Sheets

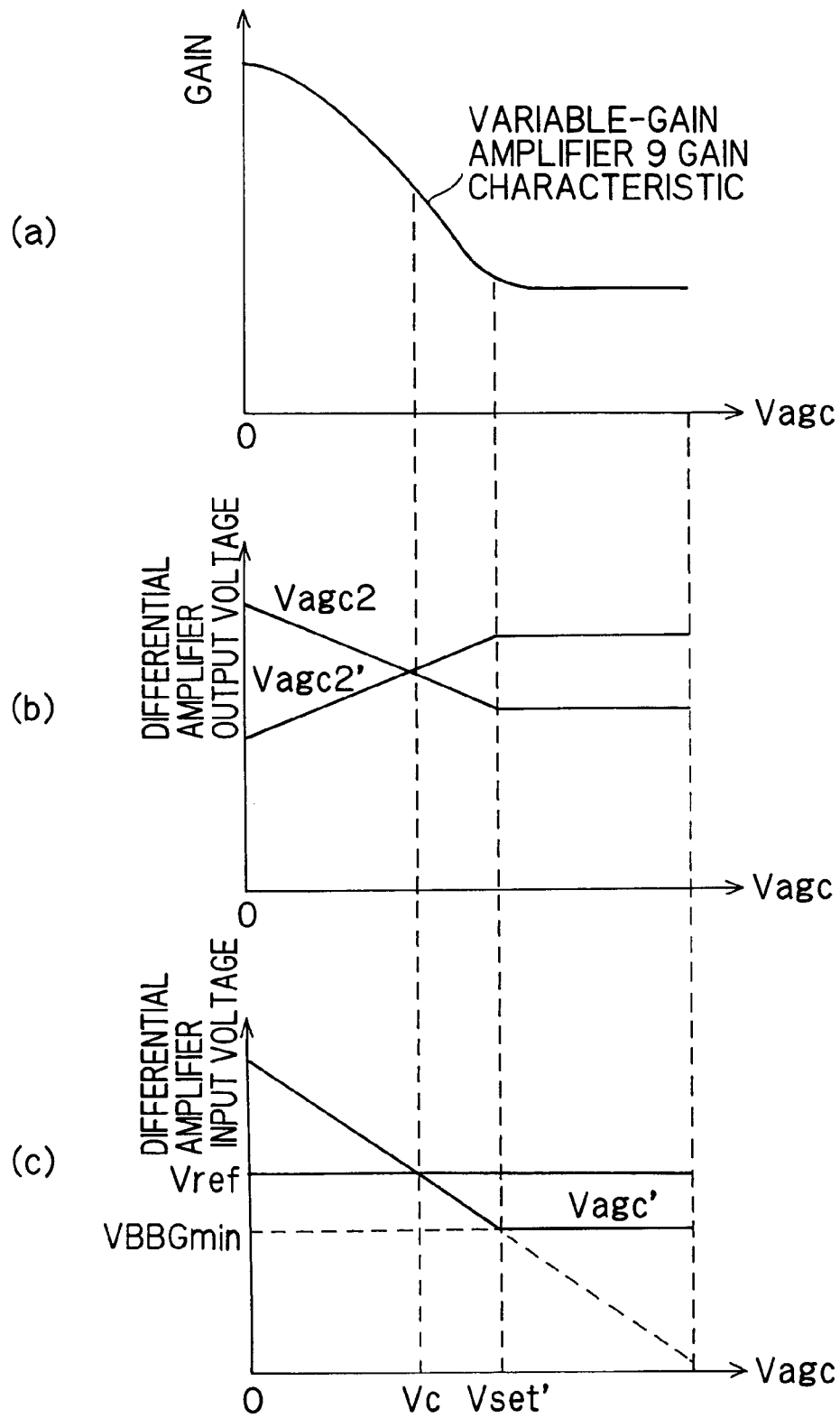

AGC AMPLIFIER CIRCUIT FOR USE IN A DIGITAL SATELLITE BROADCAST RECEIVER APPARATUS

BACKGROUND OF THE INVENTION

1. Field of the Invention

The present invention relates to an amplifier circuit for use in a digital satellite broadcast receiver apparatus.

2. Description of the Prior Art

As an example of the configuration of a digital satellite broadcast receiver apparatus, FIG. 5 shows a block diagram of a direct-conversion receiver apparatus. The circuit shown in FIG. 5 is divided roughly into three blocks, namely an antenna section 32, a tuner section 33, and a digital signal processing section 34. In the antenna section 32, a reception antenna 14 receives a satellite broadcast digital signal transmitted in a 12 GHz frequency band from a stationary satellite located up in the sky.

An LNB (low-noise amplifier and block down converter) fitted directly underneath, the reception antenna 14 amplifies the faint satellite broadcast digital signal received by the reception antenna 14 with a low-noise, high-gain amplifier, and converts the signal, in the 12 GHz frequency band when received, down to 950 to 2,150 MHz. The thus down-converted signal is then fed to the tuner section 33.

In the tuner section 33, an RF AGC amplifier circuit 16, configured as a wide-band amplifier, amplifies the signal thus down-converted to 950 to 2,150 MHz by the LNB 15. The gain of the RF AGC amplifier circuit 16 can be varied by varying a gain control voltage Vagc1. In FIG. 6, the gain characteristic of the RF AGC amplifier circuit 16 with respect to an AGC voltage Vagc is indicated by a dash-and-dot line K1. Mixer circuits 17 and 18 have the same circuit configuration and receive the same input signal; the only difference is that the local signal that is also fed to the mixer circuits 17 and 18 is fed thereto with a phase difference of 90°.

Here, to achieve direct conversion, the input signal (more precisely, the carrier of the input signal) and the local signal that are fed to the mixer circuits 17 and 18 have the same frequency, and therefore their mixing results in frequency conversion that directly yields a baseband signal. To feed the local signal with a phase difference of 90° to these mixer circuits 17 and 18, a local signal that is given as high accuracy in frequency as a reference clock by a VCO (voltage-controlled oscillator) 20 and a PLL (phase-locked loop) 23 so as to be accurately in tune with a received channel is fed directly to the mixer circuit 17 and by way of a 90° phase shifter to the mixer circuit 18.

The baseband signal thus obtained through such frequency conversion is then amplified by BB (baseband) AGC amplifier circuits 21 and 22 at a gain that varies according to a gain control voltage Vagc2. In FIG. 6, the gain characteristic of the BB AGC amplifier circuits 21 and 22 with respect to the AGC voltage Vagc is indicated by a dash-dot-dot line K2.

The gain control voltages Vagc1 and Vagc2 are adjusted by an AGC voltage control circuit 31 in such a way that, at this stage, the output level of the BB AGC amplifier circuits 21 and 22 is constant irrespective of fluctuations in the signal level of the signal fed to the RF AGC amplifier circuit 16. This is because the gain of the circuits in the succeeding stages is constant.

LPFs (low-pass filters) 24 and 25 serve to eliminate unnecessary frequency components, such as the signals of the adjacent channels other than the desired signal to be received, and have no gain. The cut-off frequency of these LPFs 24 and 25 is varied according to the band of the received signal. BB (baseband) amplifier circuits 26 and 27 have a fixed gain, and serve to amplify the baseband signal up to a level that permits digital signal processing thereof.

In the digital signal processing section 34, the baseband signal, which has by now been amplified to a sufficient level through analog signal processing, is eventually converted into a digital signal by A/D (analog-to-digital) converters 28 and 29, and is then subjected to digital signal processing by a QPSK demodulator circuit 30 so as to be demodulated into I and Q signals, i.e. back to the original form before transmission. To maximize reception performance, the tuner section 33 is so controlled as to keep its output level constant by the AGC voltage Vagc fed thereto from the digital signal processing section 34.

From the AGC voltage Vagc fed to the tuner section 33, the AGC voltage control circuit 31 produces the two control voltages Vagc1 and Vagc2. The control voltage Vagc1 is used to control the gain of the RF AGC amplifier circuit 16 and the control voltage Vagc2 is used to control the gain of the BB AGC amplifier circuits 21 and 22 so that the output level of the BB amplifier circuits 28 and 29 is kept constant. The peak value of this output level is so determined as not to exceed the input dynamic range of the A/D converters 28 and 29.

Now, how the gain of the receiver apparatus is controlled according to the above-mentioned AGC voltage Vagc will be described with respect to the system constituted by the RF AGC amplifier circuit 16, the mixer circuit 17, the BB AGC amplifier circuit 21, the LPF circuit 24, the BB amplifier circuit 26, and the A/D converter 28 shown in FIG. 5.

The gain characteristics of the RF AGC amplifier circuit 16 and the BB AGC amplifier circuit 21 with respect to the AGC voltage Vagc in this receiver apparatus and the overall gain characteristic of the receiver apparatus are shown in FIG. 6, and the gain distribution under those conditions is shown in FIG. 7. In FIG. 7, reference symbol W1 indicates the variable-gain range of the RF AGC amplifier circuit 16, reference symbol W2 indicates the variable-gain range of the BB AGC amplifier circuit 21, and reference symbol W3 indicates the variable-gain range controllable with the AGC voltage Vagc. When the input level to the RF AGC amplifier circuit 16 is zero, the AGC voltage Vagc equals 0, and the gains of the RF AGC amplifier circuit 16 and the BB AGC amplifier circuit 21 are at their maximum.

As the input level to the RF AGC amplifier circuit 16 increases, the output level of the BB amplifier circuit 26 increases. However, when the value obtained through the conversion performed by the A/D converter 28 is about to exceed the designed limit, the AGC voltage Vagc fed from the QPSK demodulator circuit 30 starts increasing, and thus the gain of the receiver apparatus starts decreasing. Here, as shown in FIG. 6, while the AGC voltage Vagc is equal to or lower than a voltage Vset, the gain of the RF AGC amplifier circuit 16 does not decrease, and only the gain of the BB AGC amplifier circuit 21 decreases.

As the input level further increases, when the AGC voltage Vagc exceeds the voltage Vset, the gain of the BB AGC amplifier circuit 21 becomes stable at a level GBBmin (i.e. the gain does not decrease any more even when the AGC voltage further increases). Simultaneously, the gain of the RF AGC amplifier circuit 16 starts decreasing from a level GRFmax. As a result of these two operations, as the AGC voltage Vagc increases, the gain of the tuner section 33 decreases until eventually, when the difference between the value obtained through the conversion performed by the A/D converter 28 and the designed limit falls within a predetermined range, the AGC voltage Vagc stops increasing and becomes stable.

To control the gains of the RF AGC amplifier circuit 16 and the BB AGC amplifier circuit 21 in such a way as to obtain their respective characteristics as described above, until the AGC voltage Vagc fed to the tuner section 33 reaches the voltage Vset, the AGC voltage control circuit 31 adjusts only the gain control voltage Vagc2 for the BB AGC amplifier circuit 21 and controls the gain control voltage Vagc1 for the RF AGC amplifier circuit 16 in such a way as to keep the gain thereof at its maximum GRFmax.

By contrast, when the AGC voltage Vagc exceeds the voltage Vset, the AGC voltage control circuit 31 keeps the gain control voltage Vagc2 for the BB AGC amplifier circuit 21 constant to maintain the gain GBBmin, and instead controls the gain control voltage Vagc1 for the RF AGC amplifier circuit 16 in such a way as to decrease the gain of the tuner section 33 so that the output level of the BB amplifier circuit 26 does not exceed the designed input level limit of the A/D converter 28.

The purpose of such gain control (i.e. activating the AGC operation of the RF AGC amplifier circuit 16 with a delay relative to that of the BB AGC amplifier circuit 21) is to obtain as wide a range as possible in which the receiver apparatus offers a satisfactory NF (noise factor) characteristic. This is the reason that, in a range in which the input level from the antenna section 32 to the tuner section 33 is comparatively low, the gain of the RF AGC amplifier circuit 16 is kept at its maximum and on the other hand the gain of the BB AGC amplifier circuit 21 is so controlled as to reduce the overall gain of the tuner section 33.

According to this gain control, however, as the input level to the tuner section 33 further increases, the gain of the BB AGC amplifier circuit 21 is not decreased any more, and instead the gain of the RF AGC amplifier circuit 16 is decreased. This is because, as the input level to the tuner section 33 increases, as shown in FIG. 7, the input level to the mixer circuit 17 increases, which leads to unignorable degradation of IM (inter-modulation distortion) characteristics. Thus, here, it is essential to reduce the gain of the RF AGC amplifier circuit 16 to prevent the input level to the mixer circuit 17 from becoming too high. The purpose of keeping the gain of the BB AGC amplifier circuit 21 at a fixed level (GBBmin) so as not to fall below that level also is to prevent the input level to the mixer circuit 17 and to the BB AGC amplifier circuit 21 from becoming to high.

In the gain control described above, the gain control voltage Vagc1 for the RF AGC amplifier circuit 16 is so controlled that it starts controlling the gain of the RF AGC amplifier circuit 16 when the AGC voltage Vagc becomes higher than the voltage Vset and then decreases the gain as the AGC voltage Vagc increases. On the other hand, the gain control voltage Vagc2 for the BB AGC amplifier circuit 21 needs to be so controlled that the gain of the BB AGC amplifier circuit 21 is fixed accurately at the level GBBmin when the AGC voltage Vagc exceeds the voltage Vset.

How this is achieved is shown in FIG. 10, and how the gain control voltage Vagc2 varies in that case is shown in FIG. 11. In FIG. 10, an amplitude limiter circuit 35 is fed with the AGC voltage Vagc via an input terminal 11, and is also fed with a voltage level Vset' for limiting the maximum level of the AGC voltage Vagc from a reference voltage generator circuit 12.

As shown at (c) in FIG. 11, an amplitude-limited voltage Vagc' output from the amplitude limiter circuit 35 and a reference voltage Vref fed from the reference voltage generator circuit 12 describe lines that cross each other, and, when the AGC voltage Vagc becomes higher than the output limit voltage Vset', the amplitude-limited voltage Vagc' is kept at a fixed voltage VBBGmin. The reference voltage Vref and the amplitude-limited voltage Vagc' are fed to a differential amplifier 13 to obtain two AGC voltages Vagc2 and Vagc2' as shown at (b) in FIG. 11. In this case, by adjusting the DC offset level and the differential potential difference of the differential amplifier 13, it is possible to make a variable-gain amplifier 9 perform gain control according to the AGC voltage Vagc.

Here, if the minimum gain GBBmin varies, the input level to the mixer 17 and to the BB AGC amplifier circuit 21 varies as described previously. Specifically, if the input level varies by 1 dB, the undesirable third-order IM component varies by 3 dB, which causes degradation by 2 dB of IM characteristics. Therefore, in the gain control performed for the BB AGC amplifier circuit 21, it is necessary to minimize fluctuations of every kind, namely not only fluctuations due to the variable-gain characteristic of the BB AGC amplifier circuit 21 itself with respect to the gain control voltage Vagc2, but also fluctuations in the operating temperature of the gain control voltage Vagc2 and in the circuit voltage levels at the minimum gain, variations in the constants of the circuit elements, etc. In the conventional example shown in FIG. 10, the minimum gain GBBmin of the BB AGC amplifier circuit 21 is determined by limiting the voltage of the AGC voltage Vagc with the amplitude limiter circuit 35.

In this case, the absolute value of the minimum gain GBBmin varies with fluctuations in the operating temperatures and the operating voltages of the variable-gain amplifier 9, the differential amplifier 13, and the amplitude limiter circuit 35 provided in the circuit block constituting the BB AGC amplifier circuit 21, and also with variations in the constants of the circuit elements. In particular, the gain-to-voltage sensitivity of the variable-gain amplifier 9 is so high that, for example, the gain varies by 1 dB as the differential potential difference varies by about 7 µV. That is, a small fluctuation in the gain control voltage Vagc2 results in a large fluctuation in the gain.

On the other hand, as shown in FIG. 8, the control voltage Vset, which determines the switching point between the gain control by the RF AGC amplifier circuit 16 and the gain control by the BB AGC amplifier circuit 21, exhibits almost no fluctuation. As a result, the slope of the gain characteristic of the BB AGC amplifier circuit 21 varies, and thus the absolute value of the minimum gain GBBmin varies. For this reason, it is essential to keep, by some means or other, the minimum gain GBBmin within a predetermined range so as to obtain satisfactory reception performance without degrading IM characteristics.

However, in realizing these circuits as an integrated circuit, there is a limit to reducing fluctuations in characteristics resulting from variations in the constants of the circuit elements within each circuit block. Thus, in realizing the desired function by combining a plurality of circuits, it is highly difficult to reduce fluctuations in the overall characteristics.

SUMMARY OF THE INVENTION

An object of the present invention is to provide an AGC amplifier circuit and a receiver apparatus with minimum fluctuations in their overall characteristics.

According to the present invention, in the BB AGC amplifier circuit 21, to determine the minimum gain in the range in which the AGC voltage Vagc is higher than the voltage Vset, instead of controlling the gain control voltages Vagc2 and Vagc2' themselves, which are fed to the variable-gain amplifier 9, by limiting the AGC voltage Vagc with the amplitude limiting circuit 35 as shown in FIG. 10, a system as shown in FIG. 1 (the present invention) is proposed in which a fixed-gain amplifier 2 whose gain does not depend on the AGC voltage Vagc is connected in parallel with the variable-gain amplifier 3 and in which the amplitude limiting circuit 35 is abolished. In the BB AGC amplifier circuit configured as shown in FIG. 1, the same variable-gain amplifier 3 as used in the conventional system is used, and the gain of the fixed-gain amplifier 2 determines the minimum gain GBBmin of the BB AGC amplifier circuit.

In the system described above in which the fixed-gain amplifier 2 and the variable-gain amplifier 3 are connected in parallel, as the AGC voltage Vagc increases, the gain of the variable-gain amplifier 3 decreases as in the conventional system. However, as this gain approaches the gain of the fixed-gain amplifier 2, the variable-gain amplifier 3 exerts less and less, and eventually no, effect, and instead the gain of the fixed-gain amplifier 2 serves as the minimum gain of the BB AGC amplifier circuit 21.

The gain of the fixed-gain amplifier 2 is not affected by the AGC voltage Vagc, and this makes it possible to minimize fluctuations in the minimum gain GBBmin of the BB AGC amplifier circuit 21 simply by minimizing fluctuations in the gain of the fixed-gain amplifier 2 resulting from fluctuations in the operating temperature and voltage thereof and variations in the constants of the circuit elements thereof.

BRIEF DESCRIPTION OF THE DRAWINGS

This and other objects and features of the present invention will become clear from the following description, taken in conjunction with the preferred embodiments with reference to the accompanying drawings in which:

FIG. 11 is a diagram showing the characteristics of the conventional AGC amplifier circuit.

DESCRIPTION OF THE PREFERRED EMBODIMENTS

Figure 1:
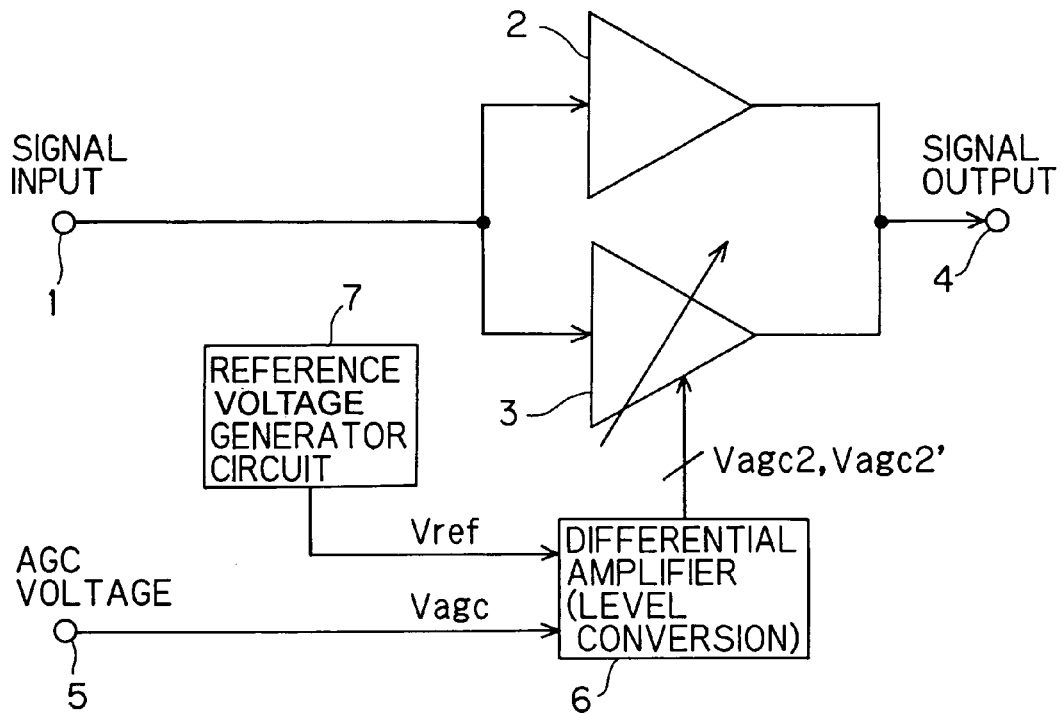
FIG. 1 is a block circuit diagram showing an AGC amplifier circuit embodying the invention.

FIG. 1 shows an AGC amplifier circuit embodying the invention. This AGC amplifier circuit is used, for example, as the BB AGC amplifier circuit 21 described previously. In FIG. 1, reference numeral 1 represents a signal input terminal, reference numeral 2 represents a fixed-gain amplifier of which the gain does not depend on an AGC voltage, reference numeral 3 represents a variable-gain amplifier, reference numeral 4 represents a signal output terminal, reference numeral 5 represents an AGC voltage input terminal, reference numeral 6 represents a differential amplifier for level conversion, and reference numeral 7 represents a reference voltage generator circuit. Here, the reference voltage generator circuit 7 is configured as a common band-gap constant-voltage circuit so as to be hardly susceptible to fluctuations in the ambient temperature and in the supplied voltage, and thus supplies a reference voltage Vref stably. The signal fed in via the terminal 1 is fed to the fixed-gain amplifier 2 and to the variable-gain amplifier 3.

Figure 2:
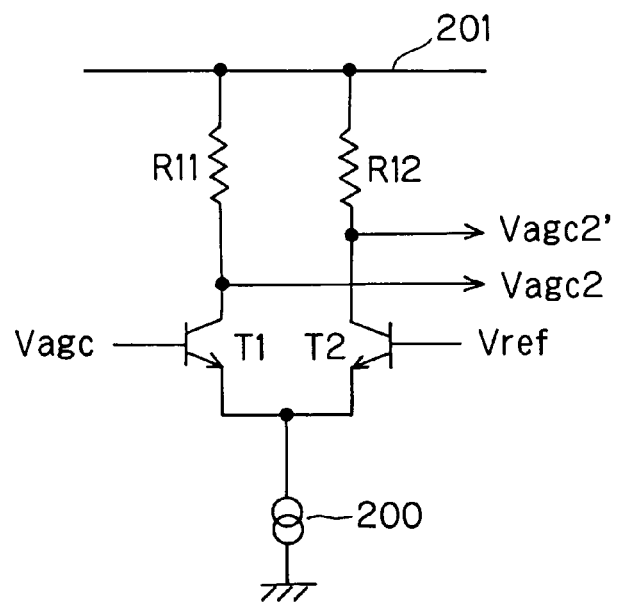
FIG. 2 is a circuit diagram showing a practical example of the configuration of a part of the AGC amplifier circuit shown in FIG. 1.

FIG. 2 shows a practical example of the configuration of the differential amplifier 6 mentioned above. NPN-type transistors T1 and T2 form a differential pair, with their collectors connected to a supplied voltage line through resistors R11 and R12, respectively, and their emitters connected to a constant-current source 200. The transistor T1 receives, at its base, the AGC voltage Vagc, and the transistor T2 receives, at its base, the reference voltage Vref. The transistors T1 and T2 output, at their respective collectors, AGC voltages Vagc2' and Vagc2, respectively. These AGC voltages Vagc2' and Vagc2 vary according to the AGC voltage Vagc as shown at (b) in FIG. 4.

Figure 4:
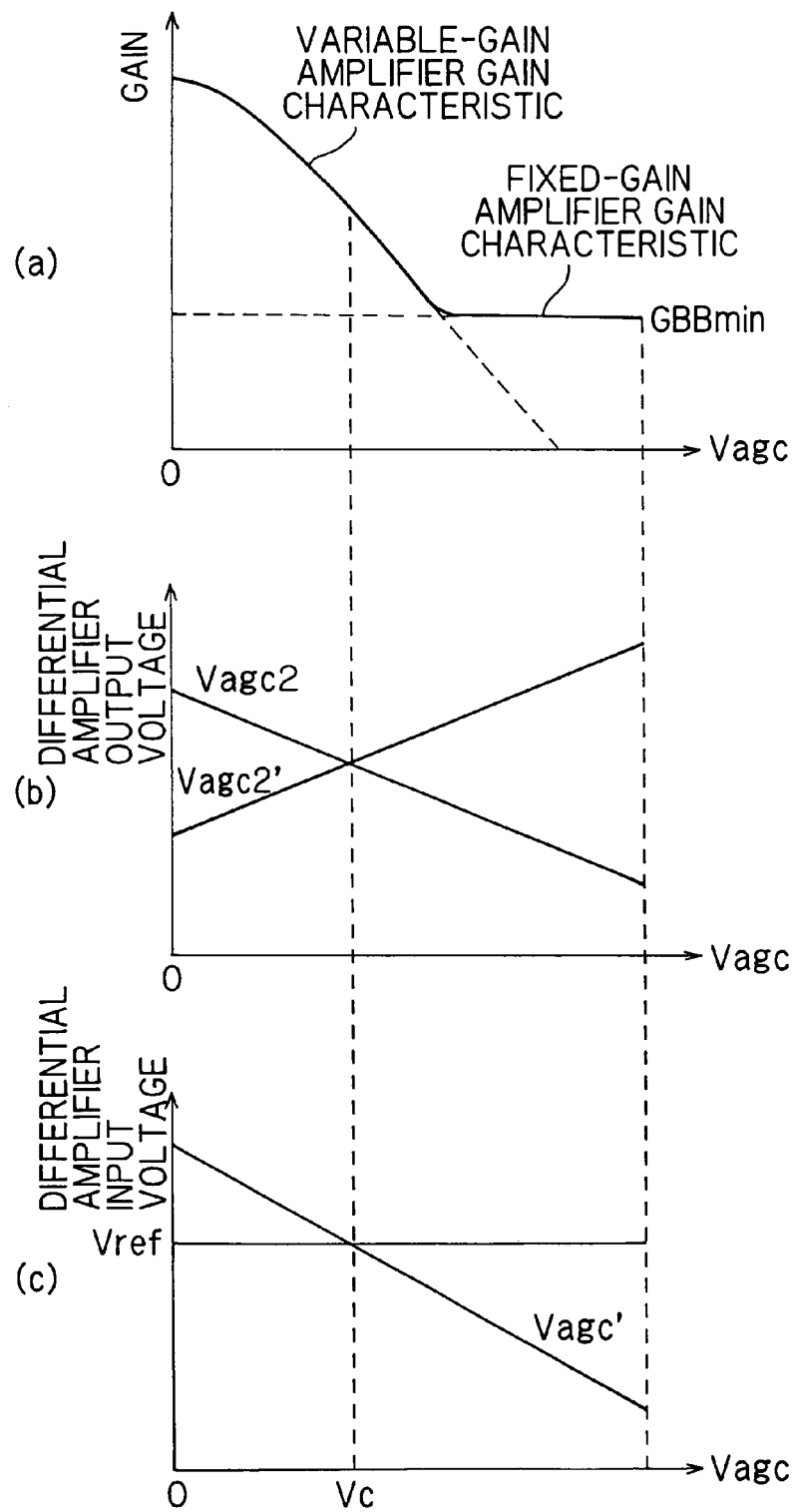
FIG. 4 is a characteristics diagram illustrating the operation of the AGC amplifier circuit shown in FIG. 1.
Figure 5:
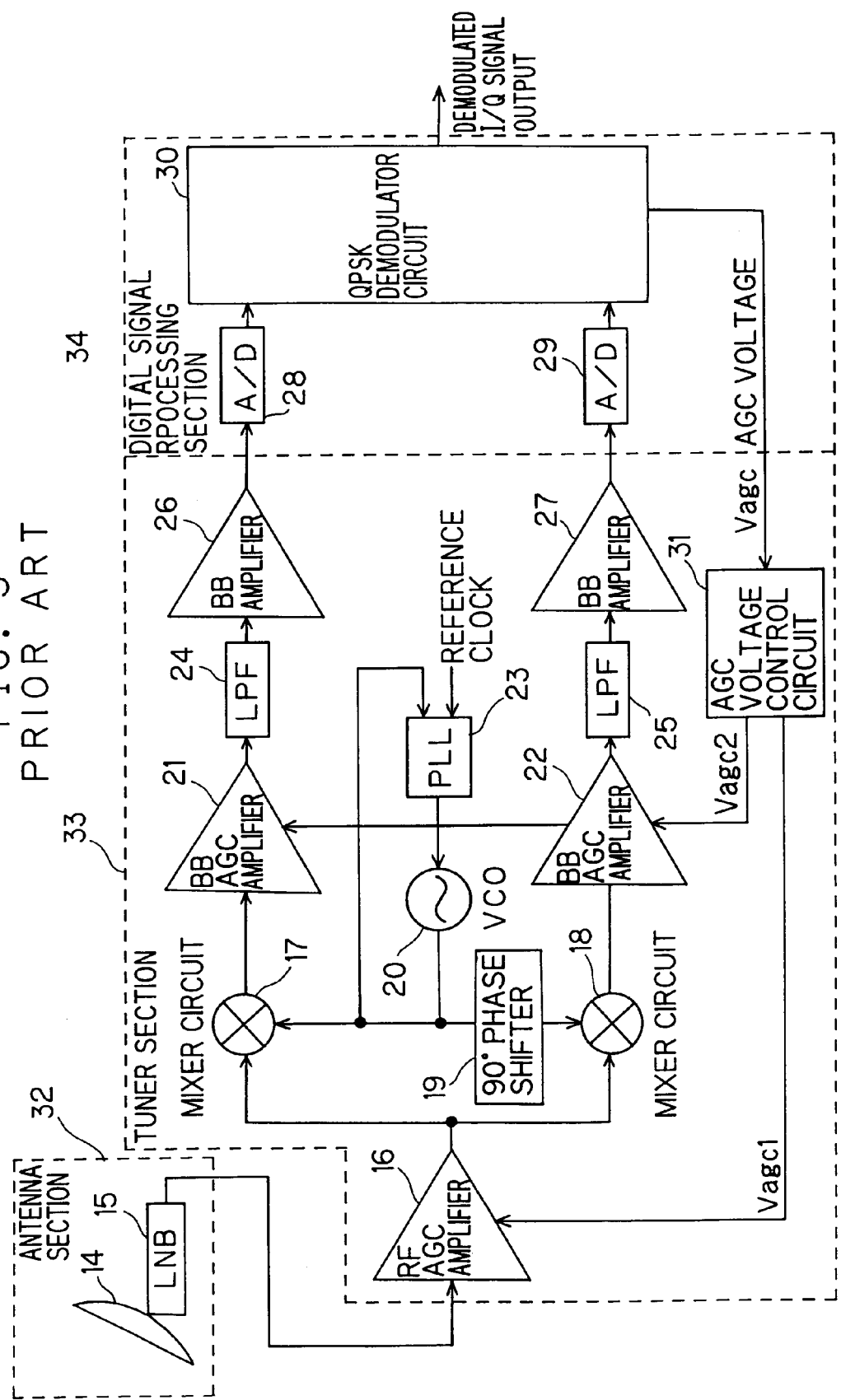
FIG. 5 is a block circuit diagram of a digital satellite broadcast receiver apparatus.
Figure 6:
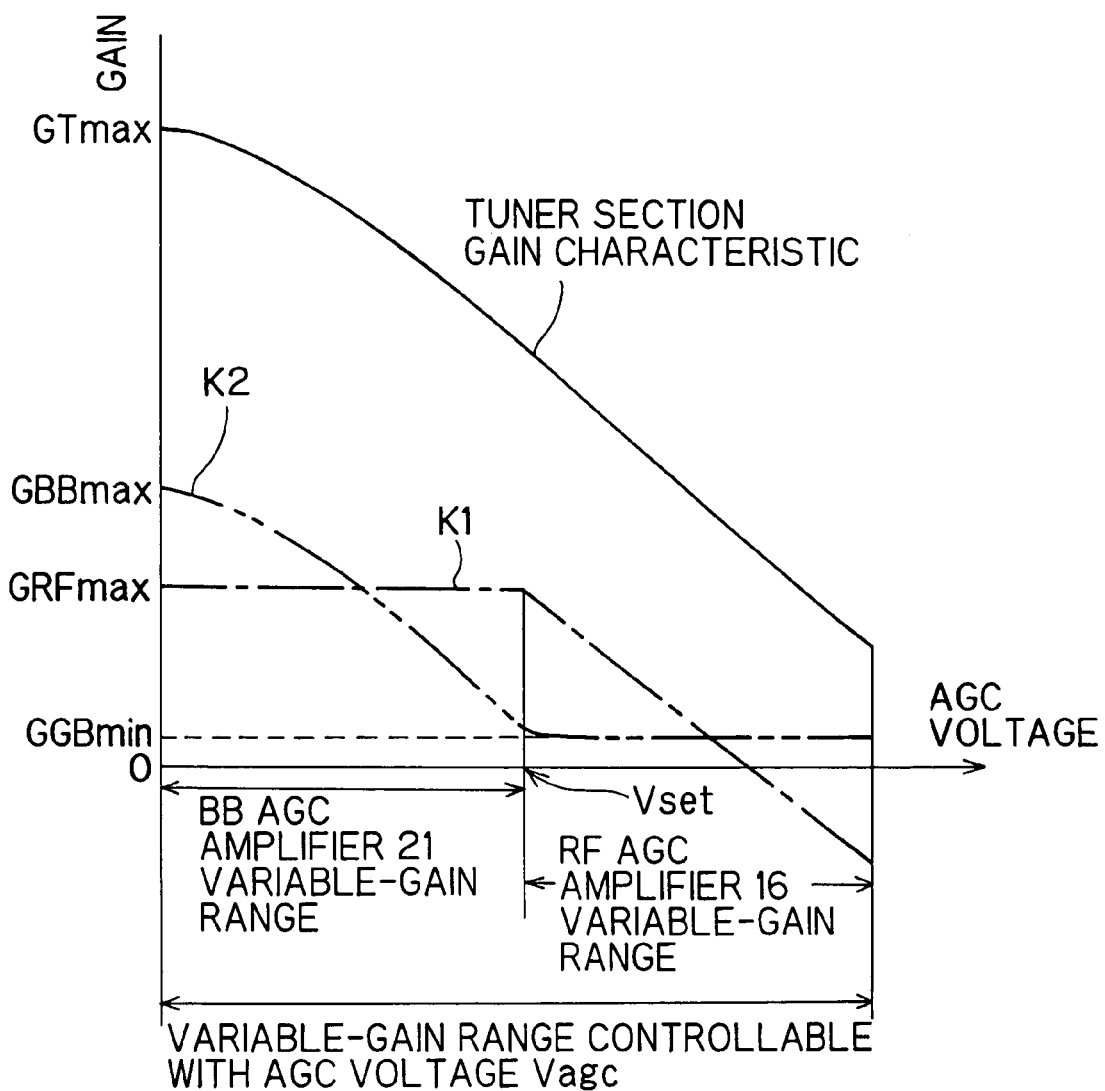
FIG. 6 is a diagram showing the AGC characteristics of an AGC amplifier circuit.
Figure 7:
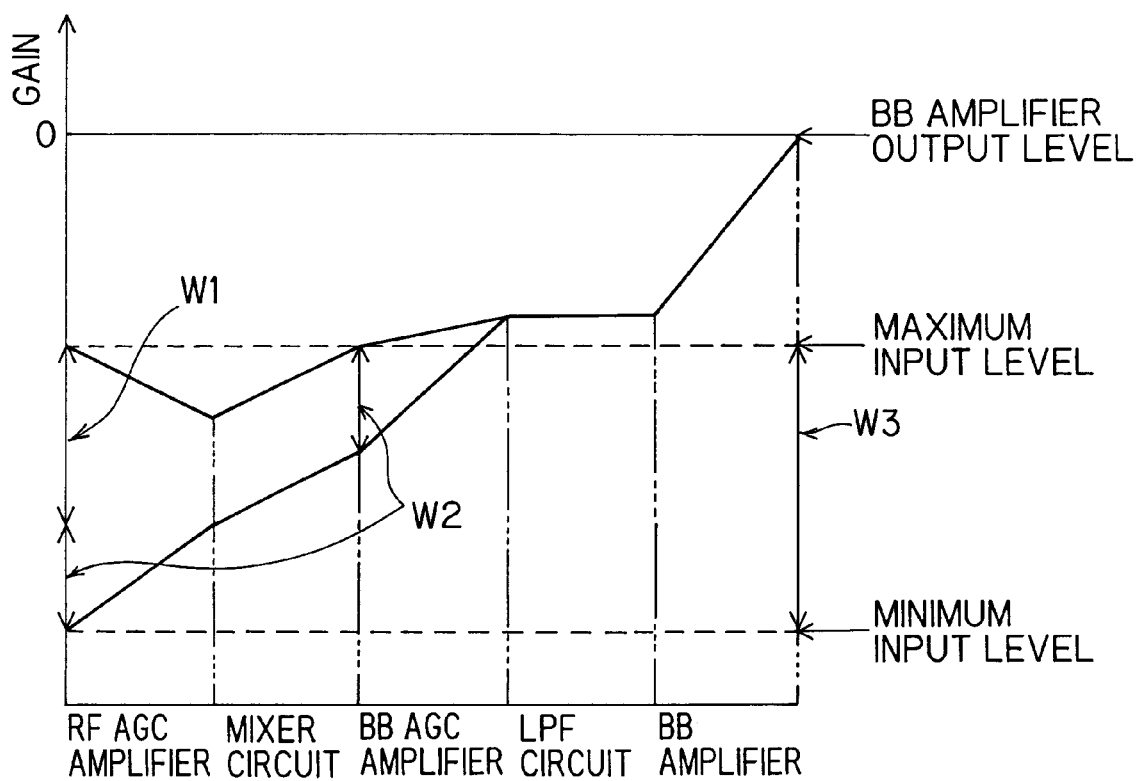
FIG. 7 is a diagram showing the gain distribution among the individual circuit blocks in the tuner section of a digital satellite broadcast receiver apparatus.
Figure 8:
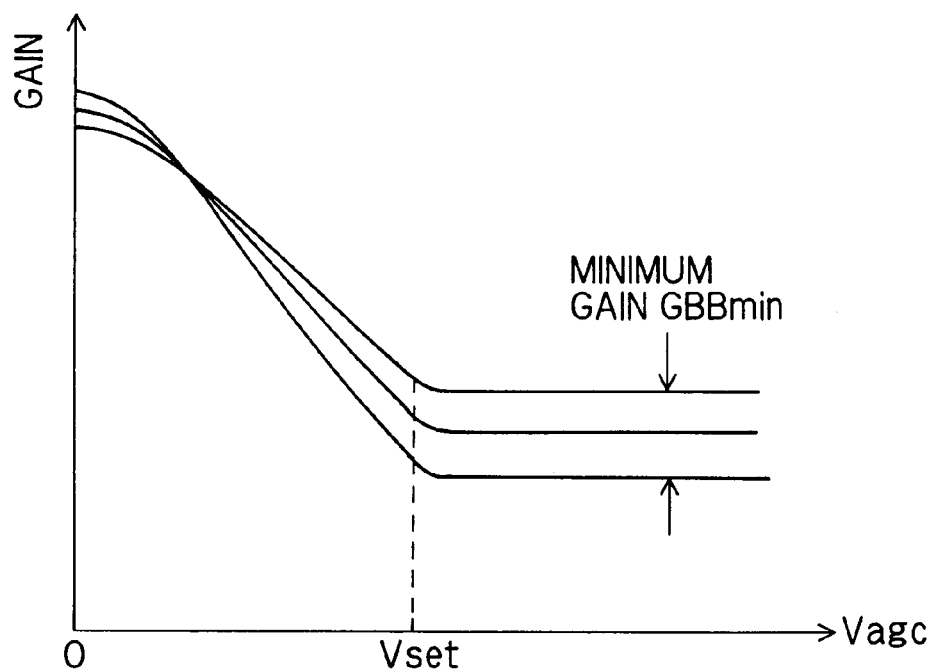
FIG. 8 is a diagram showing the fluctuation of the minimum gain in a conventional AGC amplifier circuit.
Figure 9:
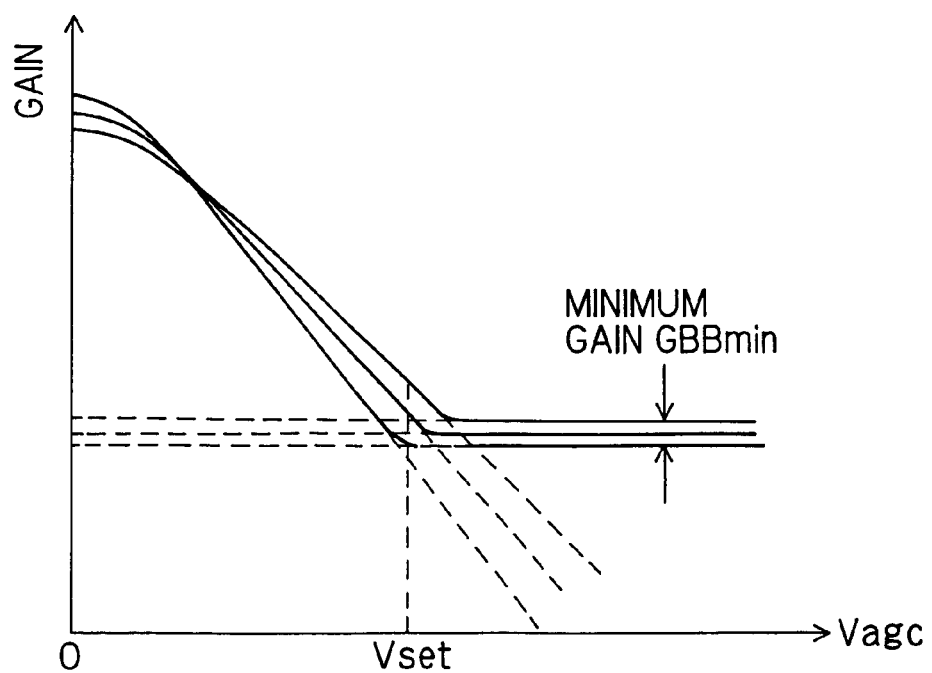
FIG. 9 is a diagram showing the fluctuation of the minimum gain in the AGC amplifier circuit embodying the invention.
Figure 10:
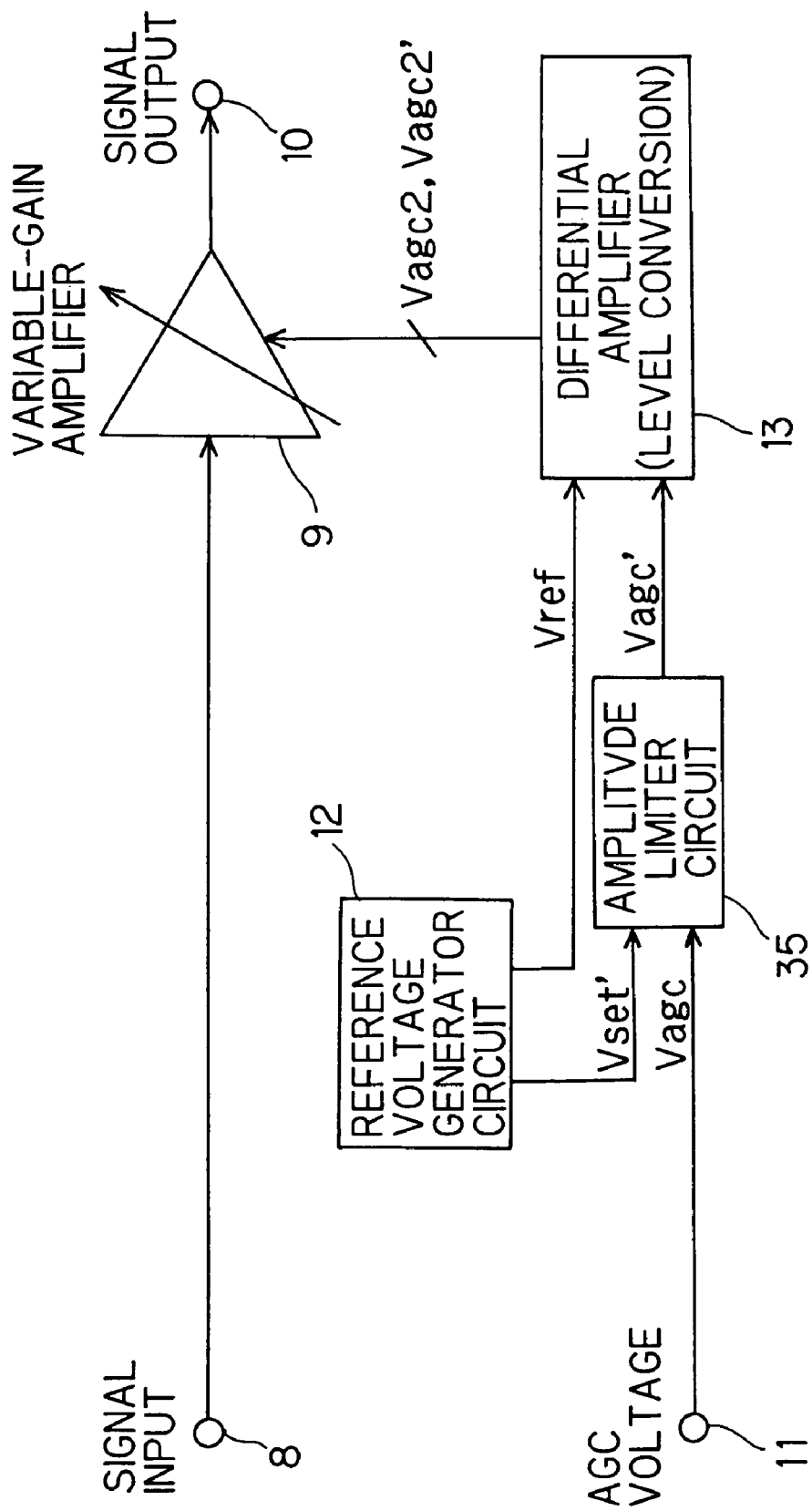
FIG. 10 is a block circuit diagram showing a conventional AGC amplifier circuit.

In the AGC amplifier circuit shown in FIG. 1, as shown at (a) in FIG. 4, as the AGC voltage Vagc increases, the gain of the variable-gain amplifier 3 decreases. When the gain of the variable-gain amplifier 3 is higher than the gain of the fixed-gain amplifier 2, the gain of the variable-gain amplifier 3 determines the overall gain of the BB AGC amplifier circuit, and, when the gain of the variable-gain amplifier 3 is lower than the gain of the fixed-gain amplifier 2, the gain of the fixed-gain amplifier 2 determines the overall gain of the BB AGC amplifier circuit.

Figure 3:
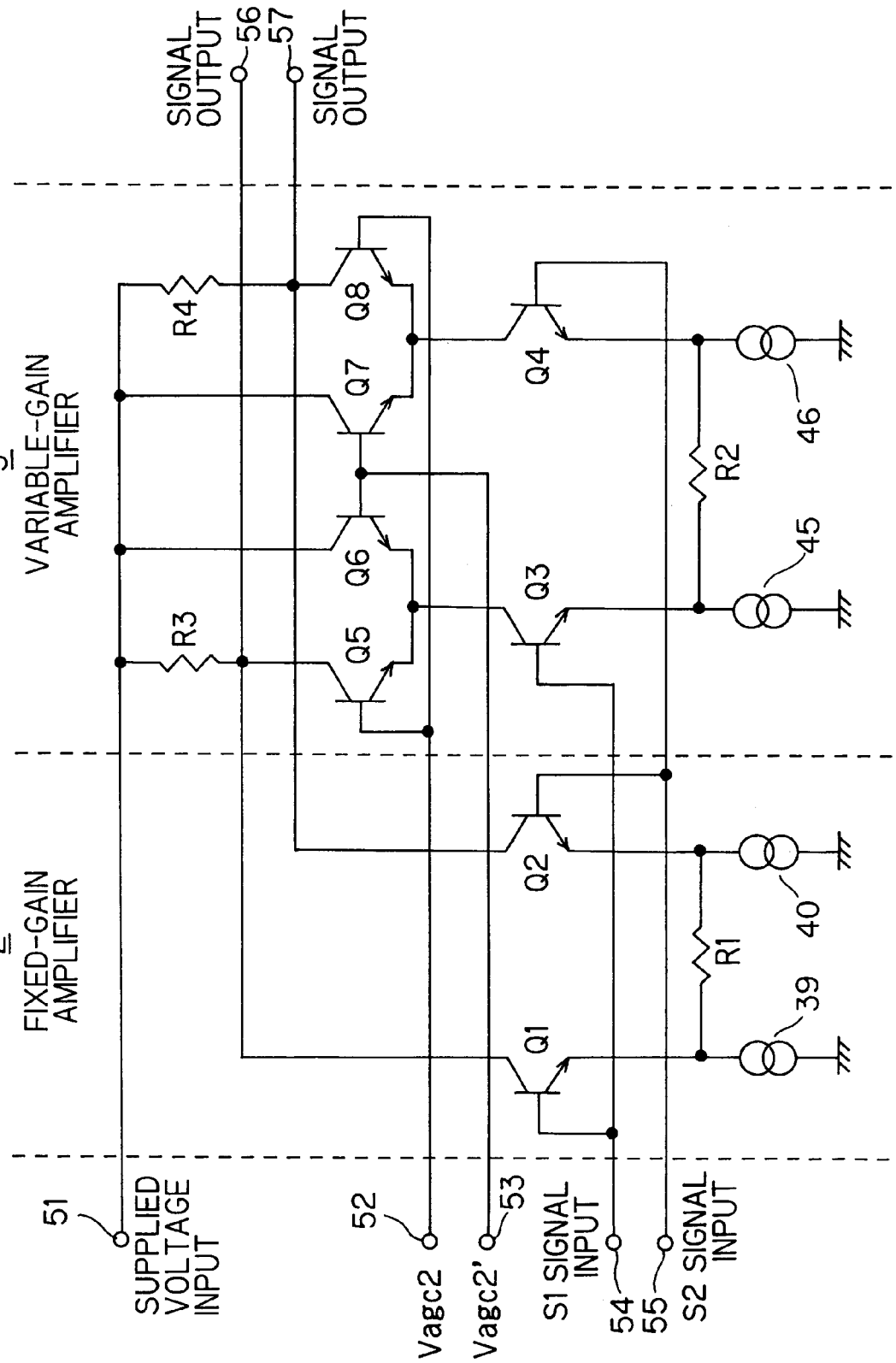
FIG. 3 is a circuit diagram showing a practical example of the configuration of another part of the AGC amplifier circuit shown in FIG. 1.

FIG. 3 shows a practical example of the configuration of the fixed-gain amplifier 2 and the variable-gain amplifier 3 mentioned above. In this figure, NPN-type transistors Q1 and Q2, a resistor R1, and constant-current sources 39 and 40 constitute the fixed-gain amplifier 2. On the other hand, NPN-type transistors Q3 to Q8, a resistor R2, and constant-current sources 45 and 46 constitute the variable-gain amplifier 3. Load resistors R3 and R4 are shared by the fixed-gain amplifier 2 and the variable-gain amplifier 3. The fixed-gain amplifier 2 is configured as a differential amplifier, and the variable-gain amplifier 3 is configured as a double-balanced differential amplifier.

Input signals S1 and S2, which vary on a differential basis relative to each other (i.e. differential signals), are fed in via terminals 54 and 55, and are then fed to the bases of the transistors Q1 and Q2, which form a differential pair in the fixed-gain amplifier 2, and also to the bases of the transistors Q3 and Q4, which form a lower differential pair in the variable-gain amplifier 3. The AGC voltages Vagc2 and Vagc2', which vary on a differential basis relative to each other, are fed in via terminals 52 and 53; then, the former is fed to the bases of the transistors Q5 and Q8 and the latter is fed to the bases of the transistors Q6 and Q7, among the transistors Q5 to Q8 constituting upper differential pairs in the variable-gain amplifier 3. A direct-current supplied voltage Vcc is fed in via a terminal 51.

Now, the operation of the circuit shown in FIG. 3 will be described. When the AGC voltage Vagc2 thus fed in is higher than the AGC voltage Vagc2' thus fed in, and in addition the potential difference between them is large, more current flows through the transistors Q5 and Q8, and thus more signal current flows through the load resistors R3 and R4, increasing the gain of the variable-gain amplifier 3. As a result, the input signals S1 and S2 are amplified at a high gain, and are then delivered to output terminals 56 and 57. As the potential difference between the AGC voltages Vagc2 and Vagc2' becomes smaller, the voltage (i.e. the output voltage) delivered to the output terminals 56 and 57 becomes lower. On the other hand, since the gain of the fixed-gain amplifier 2 is very low, its output signal can be ignored. Thus, the signal delivered to the output terminals 56 and 57 consists mostly of the signal amplified by the variable-gain amplifier 3.

Next, when the difference between the AGC voltages Vagc2 and Vagc2' becomes still smaller and eventually their relation is reversed, as long as the difference is small, the transistors Q5 and Q8 are kept on, but, when the difference becomes large, the transistors Q5 and Q8 are turned off.

In this state, the current flowing through the load resistors R3 and R4 consists solely of the current output from the transistors Q1 and Q2 of the fixed-gain amplifier 2. That is, the variable-gain amplifier 3 remains substantially inactive, and only the fixed-gain amplifier 2 is active. This makes the gain of the BB AGC amplifier circuit 21 equal to the gain (i.e. GBBmin) of the fixed-gain amplifier 2.

In the embodiment described above, as the AGC voltage Vagc increases, even if the gain characteristic of the variable-gain amplifier 3 varies as a result of fluctuations in the operating temperature and voltage thereof and variations in the constants of the circuit elements thereof, the minimum gain GBBmin of the BB AGC amplifier circuit as a whole is determined solely by the gain of the fixed-gain amplifier 2 in the range in which the gain of the variable-gain amplifier 3 is lower than the gain of the fixed-gain amplifier 2.

Moreover, fluctuations in this minimum gain GBBmin are determined solely by fluctuations in the gain of, and thus inherent in, the fixed-gain amplifier 2, and therefore are not affected by fluctuations in the gain of the variable-gain amplifier 3. This makes it possible to minimize fluctuations in IM characteristics resulting from fluctuations in the minimum gain GBBmin.

As described above, practicing the present invention makes it possible to reduce fluctuations in the minimum gain of, for example, a BB AGC amplifier circuit, and thereby reduce fluctuations in the reception performance, specifically IM characteristics, of a digital satellite broadcast receiver apparatus.

What is claimed is:

1. An AGC amplifier circuit comprising:
    a variable-gain amplifier circuit to which an AGC voltage for varying a gain thereof is directly fed and whose gain is controlled by the AGC voltage; and
    a fixed-gain amplifier circuit whose gain is not controlled by the AGC voltage;
    wherein, when the AGC voltage is within a predetermined voltage range, an overall gain of the AGC amplifier circuit is varied by the variable-gain amplifier circuit and, when the AGC voltage is outside the predetermined voltage range, the overall gain is kept constant by the fixed-gain amplifier circuit.

2. An AGC amplifier circuit as claimed in claim 1, wherein a minimum gain of the AGC amplifier circuit is set to be equal to the gain of the fixed-gain amplifier circuit.

3. An AGC amplifier circuit comprising:
    a variable-gain amplifier circuit to which an AGC voltage for varying a gain thereof is directly fed and whose gain is controlled by the AGC voltage;
    a fixed-gain amplifier circuit whose gain is not controlled by the AGC voltage; and
    input means for feeding an identical signal to the fixed-gain amplifier circuit and to the variable-gain amplifier circuit,
    wherein, when an output of the variable-gain amplifier circuit exceeds an output of the fixed-gain amplifier circuit, the output of the fixed-gain amplifier circuit is delivered to an output terminal instead of the output of the variable-gain amplifier circuit, which is otherwise delivered to the output terminal.

4. An AGC amplifier circuit as claimed in claim 3, wherein the fixed-gain amplifier circuit and the variable-gain amplifier circuit are each composed of a first differential amplifier circuit and a second differential amplifier circuit that are so connected as to share a common load resistor, and, in the second differential amplifier circuit constituting the variable-gain amplifier circuit, when a transistor to which the AGC voltage is applied and that is connected to the load resistor is brought into a cut-off state by the AGC voltage, only a current output from the first differential amplifier circuit constituting the fixed-gain amplifier circuit flows through the load resistor and a voltage appearing across the load resistor is delivered as the output of the fixed-gain amplifier circuit to the output terminal.

5. A satellite broadcast receiver apparatus comprising a first variable-gain amplifier circuit for amplifying a received radio-frequency signal, a mixer for performing frequency conversion to convert the amplified radio-frequency signal to an intermediate-frequency or baseband signal, a second variable-gain amplifier circuit for amplifying an output of the mixer, and an AGC voltage control circuit for feeding an AGC voltage first to the second variable-gain amplifier circuit and then to the first variable-gain amplifier circuit with a delay,
    wherein the second variable-gain amplifier circuit comprises a fixed-gain amplifier circuit whose gain is not controlled by the AGC voltage, a variable-gain amplifier circuit whose gain is controlled by the AGC voltage, and input means for feeding an identical signal to the fixed-gain amplifier circuit and to the variable-gain amplifier circuit, wherein, when an output of the variable-gain amplifier circuit exceeds an output of the fixed-gain amplifier circuit, the output of the fixed-gain amplifier circuit is delivered to an output terminal instead of the output of the variable-gain amplifier circuit, which is otherwise delivered to the output terminal.

6. A satellite broadcast receiver apparatus as claimed in claim 5,
    wherein the fixed-gain amplifier circuit and the variable-gain amplifier circuit are each composed of a first differential amplifier circuit and a second differential amplifier circuit that are so connected as to share a common load resistor, and, in the second differential amplifier circuit constituting the variable-gain amplifier circuit, when a transistor to which the AGC voltage is applied and that is connected to the load resistor is brought into a cut-off state by the AGC voltage, only a current output from the first differential amplifier circuit constituting the fixed-gain amplifier circuit flows through the load resistor and a voltage appearing across the load resistor is delivered as the output of the fixed-gain amplifier circuit to the output terminal.

7. An AGC amplifier circuit comprising:
a variable-gain amplifier circuit to which an AGC voltage for varying a gain thereof is directly fed and whose gain is controlled by the AGC voltage; and
a fixed-gain amplifier circuit whose gain is not controlled by an AGC voltage;
wherein the fixed-gain amplifier and the variable-gain amplifier share a common output port,
wherein, when the AGC voltage is within a predetermined voltage range, an overall gain of the AGC amplifier circuit at the common output port is varied by the variable-gain amplifier circuit and, when the AGC voltage is outside the predetermined voltage range, the overall gain at the common output port is kept constant by the fixed-gain amplifier circuit.

8. The AGC amplifier circuit as claimed in claim 7, wherein a minimum gain of the AGC amplifier circuit is set to be equal to the gain of the fixed-gain amplifier circuit.

9. An AGC amplifier circuit comprising:
a variable-gain amplifier circuit to which an AGC voltage for varying a gain thereof is directly fed and whose gain is controlled by the AGC voltage;
a fixed-gain amplifier circuit whose gain is not controlled by the AGC voltage; and
input means for feeding an identical input signal to the fixed-gain amplifier circuit and to the variable-gain amplifier circuit,
wherein, when an output of the variable-gain amplifier circuit exceeds an output of the fixed-gain amplifier circuit, the output of the fixed-gain amplifier circuit is delivered to a common output terminal instead of the output of the variable-gain amplifier circuit, which is otherwise delivered to the common output terminal.

* * * * *